United States Patent [19]

Sawada et al.

[11] Patent Number: 5,210,437
[45] Date of Patent: May 11, 1993

[54] MOS DEVICE HAVING A WELL LAYER FOR CONTROLLING THERSHOLD VOLTAGE

[75] Inventors: Shizuo Sawada, Yokohama; Seiko Iwasaki, Tokyo, both of Japan

[73] Assignee: Kabushiki Kaisha Toshiba, Kawasaki, Japan

[21] Appl. No.: 925,411

[22] Filed: Aug. 10, 1992

Related U.S. Application Data

[63] Continuation of Ser. No. 681,927, Apr. 8, 1991, abandoned.

[30] Foreign Application Priority Data

Apr. 20, 1990 [JP] Japan ............... 2-104580

[51] Int. Cl.$^5$ ............................................ H01L 29/78
[52] U.S. Cl. ............................. 257/392; 257/327; 257/402; 257/403
[58] Field of Search .............. 357/23.12, 41, 42, 23.4

[56] References Cited

U.S. PATENT DOCUMENTS 4,893,164  1/1990  Shirato .................. 357/42
4,987,465  1/1991  Longcor et al. ......... 357/41

FOREIGN PATENT DOCUMENTS 0055552  7/1982  European Pat. Off. ......... 357/23.12
56-4279  1/1981  Japan ........................ 357/23.12
59-61059  4/1984  Japan ........................ 357/23.12
63-241965 10/1988  Japan ........................ 357/23.12

OTHER PUBLICATIONS

Patent Abstracts of Japan, vol. 11, No. 174 (E-513) (2621), Jun. 4, 1987; & JP-A-628553 (Toshiba) 16.01.1987.
Stengl et al., I.E.E.E. Transactions on Electron Devices, vol. ED-33, No. 3 Mar. 1986, pp. 426-428.

*Primary Examiner*—Andrew J. James
*Assistant Examiner*—Courtney A. Bowers
*Attorney, Agent, or Firm*—Banner, Birch McKie & Beckett

[57] ABSTRACT

The present invention provides a semiconductor device having a well, formed in a semiconductor substrate by using a mask in which a mask pattern width of a portion corresponding to an opening diameter is equal to or less than twice the diffusion depth of the well layer, and a gate electrode formed to have the well layer as a channel region of a MOS transistor. The well formed in this manner has a substantially semi-circular section to facilitate impurity concentration control in the substrate surface. When a plurality of types of opening patterns having small pattern widths are formed in a single mask, MOS transistors having different threshold voltages can be formed in a single process.

15 Claims, 5 Drawing Sheets

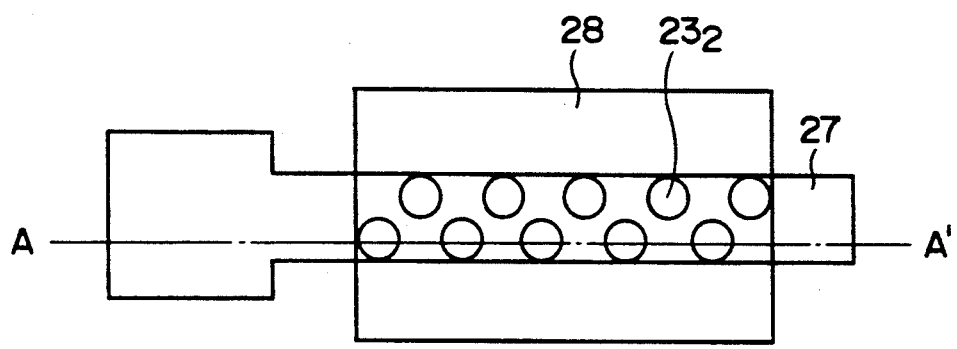
F I G. 4A
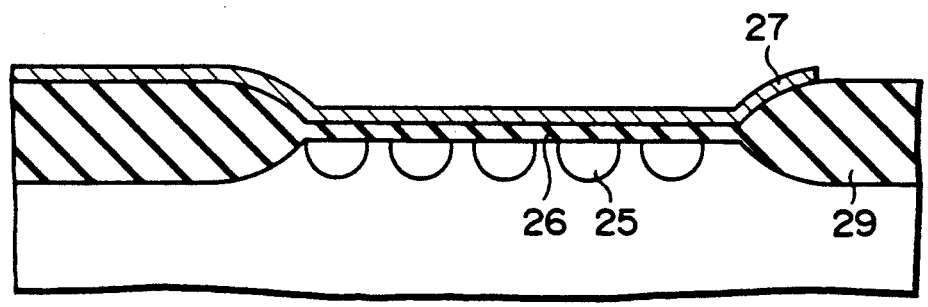
F I G. 4B

MOS DEVICE HAVING A WELL LAYER FOR CONTROLLING THERSHOLD VOLTAGE

This application is a continuation, of application Ser. No. 07/681,927, filed Apr. 8, 1991, abandoned.

BACKGROUND OF THE INVENTION

1. Field of the Invention

The present invention relates to a semiconductor device and a method of manufacturing the same and, more particularly, to a semiconductor device and a method of manufacturing the same, which are suitably used when MOS transistors having different threshold voltages ar to be obtained by a single step.

2. Description of the Related Art

Conventionally, the threshold voltage of a MOS transistor and, more particularly, of a D-type (Depletion) transistor, is determined by the type and amount of an impurity used for the step of ion implantation in a channel, as shown in FIGS. 1A to 1C. FIG. 1A shows a step of forming a gate insulating film 2 having a thickness of, e.g., 200 A on, e.g., a p-type semiconductor substrate 1. FIG. 1B shows a step of ion implantation in a channel for controlling the threshold voltage of a MOS transistor. In FIG. 1B, phosphorus ions 3 are implanted at an acceleration energy of 70 KeV to a concentration of about $1 \times 10^{12}$ cm$^{-2}$ in order to form, e.g., a depletion-type transistor. FIG. 1C shows a step of forming a gate electrode 4 and source and drain diffusion layers 5. In this case, when n-type polysilicon is used as the material of the gate electrode 4, the threshold voltage of the transistor is about $-2$ V. Reference numeral 6 denotes an insulating film; and 7, an aluminum wiring layer.

In this conventional example, however, when transistors having different threshold voltages are to be formed, different types of ions must be implanted in different amounts at different places in order to set different threshold voltages. In other words, the same number of photoengraving steps as that of the required threshold voltages are required, resulting in a great increase in the number of steps. A conventional well layer is obtained by performing impurity implantation through a considerably large opening of a mask pattern (opening diameter). Therefore, the conventional well have a uniform surface impurity concentration. To form transistors having different threshold voltages in the conventional well, it is also necessary to implant different types of ions in different amounts into the different parts of the well. In this case, too, the same number of photoengraving steps as that of the threshold voltages need to be performed.

SUMMARY OF THE INVENTION

The present invention has been made in view of the above situation and has as its object to provide a semiconductor device having different threshold voltages in a plurality of MOS transistors, and a method of manufacturing the same with fewer steps than in a conventional method.

In order to achieve this object, a semiconductor device according to the present invention comprises a semiconductor substrate of one conductivity type, a MOS transistor, formed in the semiconductor substrate and having source and drain layers of a conductivity type opposite to that of the semiconductor substrate, and a well layer formed in the vicinity of a channel region of the MOS transistor to control a threshold voltage thereof, wherein the well layer has a substantially semi-circular section with a non-flat lower surface. Also, a method of the present invention comprises the steps of forming a mask in which a mask pattern width of a portion corresponding to a mask opening diameter is equal to or less than twice the diffusion depth of a well layer, and implanting an impurity in a prospective channel portion of a MOS transistor of a semiconductor substrate by using the mask, thereby forming the well layer.

More specifically, according to the present invention, there is provided a semiconductor device having a well formed in a semiconductor substrate by setting the width of a portion of a mask pattern, used for impurity implantation, that corresponds to an opening diameter to be equal to or less than twice the diffusion depth of a well layer, and gate electrodes formed to have the well layer as a channel region of a MOS transistor. The well formed in the above manner has a substantially semi-circular section to facilitate impurity concentration control in the surface of the substrate (in the conventional well, since the impurity is implanted through a portion of a mask pattern having a considerably larger width than in the present invention, the surface concentration is uniform and it is difficult to control the threshold voltage). Furthermore, since a plurality of types of opening patterns having a small mask pattern width are formed in a single mask, MOS transistors having different threshold voltages can be formed in a single process.

Additional objects and advantages of the invention will be set forth in he description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a plan view of a pattern of another embodiment of the present invention, and FIG. 4B is a sectional view taken along the line A—A' of FIG. 4A;

DETAILED DESCRIPTION OF THE PREFERRED EMBODIMENTS

Figure 1A:
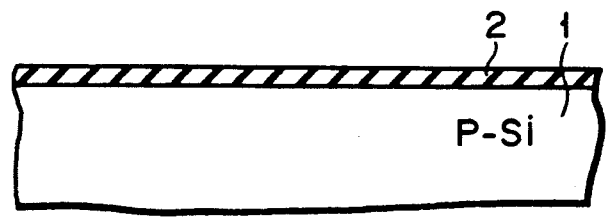
FIGS. 1A to 1C show steps of manufacturing a conventional semiconductor device.
Figure 1B:
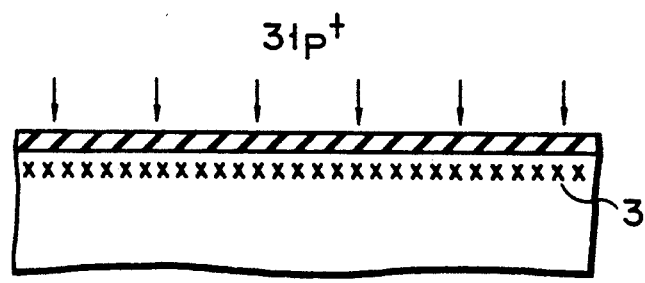
Figure 1C:
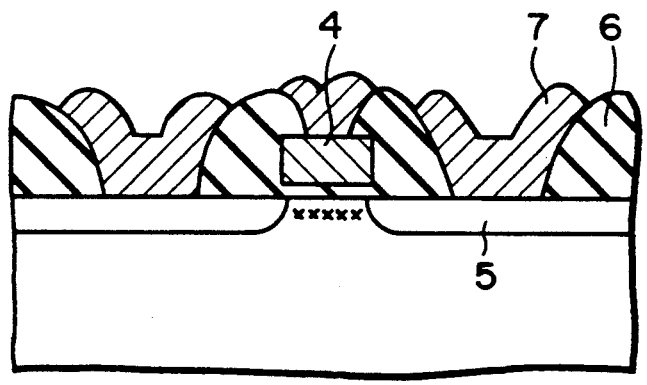
Figure 2A:
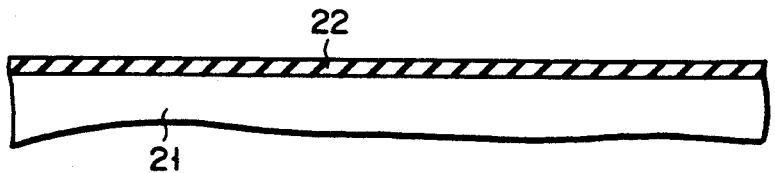
FIGS. 2A to 2E show steps of manufacturing a semiconductor device according to an embodiment of the present invention.
Figure 2B:
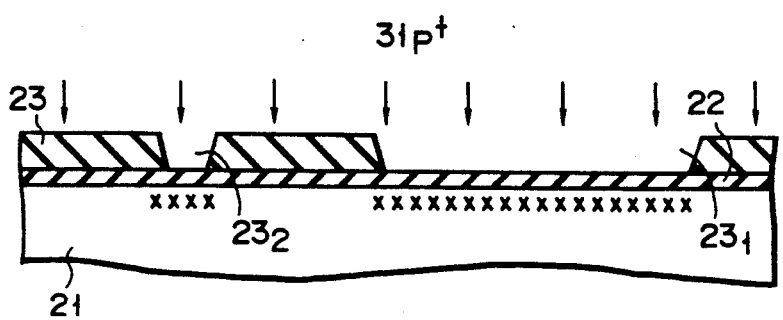

An embodiment of the present invention will be described with reference to FIGS. 2A to 2E. First, as shown in FIG. 2A, a first thermal oxide film 22 is formed on a p-type substrate 21 having an impurity concentration of about $3 \times 10^{15}$ cm$^{-3}$. Subsequently, a resist mask 23 having resist patterns of different opening widths (mask pattern widths) is formed on prospective depletion-type transistor regions, as shown in FIG. 2B. Phosphorus ions are implanted in the substrate 21 at a dose of about $7 \times 10^{13}$ cm$^{-2}$ and an acceleration energy of 70 KeV. The structure is then annealed at 1,150° C. for about 4 hours to diffuse the phosphorus. As a result, a depth $X_{j1}$ of a diffusion layer 24 formed by phosphorus diffusion using a resist pattern $23_1$ having a large width, e.g., 8 μm, is about 3 μm. The surface phosphorus concentration is about $3 \times 10^{17}$ cm$^{-3}$. However, a depth $X_{j2}$ of a well 25 formed by using a resist pattern $23_2$ having a small width of 1 μm becomes 1 μm, and the surface concentration thereof is about $5 \times 10^{16}$ cm$^{-3}$.

Thereafter, the oxide film 22 is removed, and a gate insulating film 26 is deposited for about 200Å. MOS transistor gate electrodes 27 are formed at portions corresponding to the resist patterns $23_1$ and $23_2$. Source and drain diffusion layers 28 are formed by, e.g., ion implantation. Then, an aluminum wiring layer 30 is formed over an insulating film 29 formed on the substrate as shown in FIG. 2E, thus completing MOS transistors.

Figure 2C:
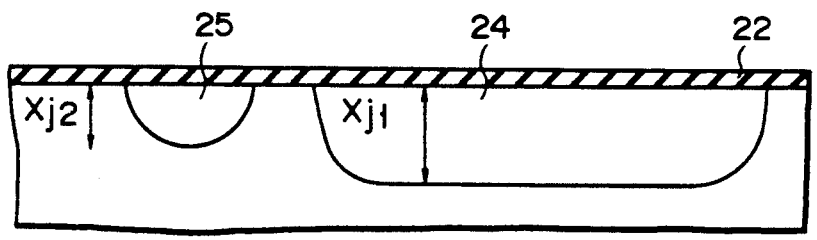
Figure 2D:
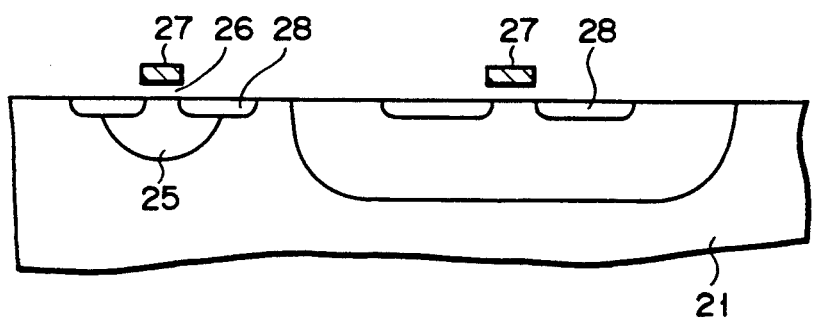
Figure 2E:
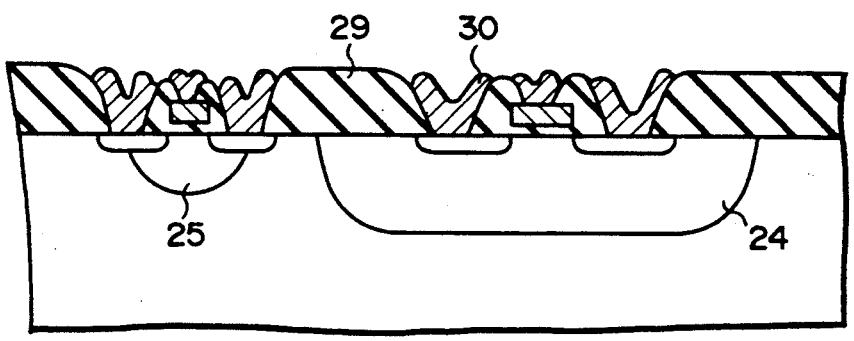

The well 24 shown in FIGS. 2C to 2E is formed using the resist pattern $23_1$ having a mask width greatly larger than twice its diffusion depth $X_{j1}$ and corresponds to a conventional well. The well 25 is formed by using the resist pattern $23_2$ having a mask width equal to or less than twice its diffusion depth $X_{j2}$. The well 25 has a substantially semi-circular section and is appropriate for threshold voltage control. This is because when a pattern opening diameter is small, the impurity concentration and the depth of a diffusion layer (especially that of an ion-implantation type) are determined by the pattern opening diameter. In this case, the length of the gate electrode on the well 25 in the channel lengthwise direction is also equal to or less than twice its well diffusion depth.

Figure 3A:
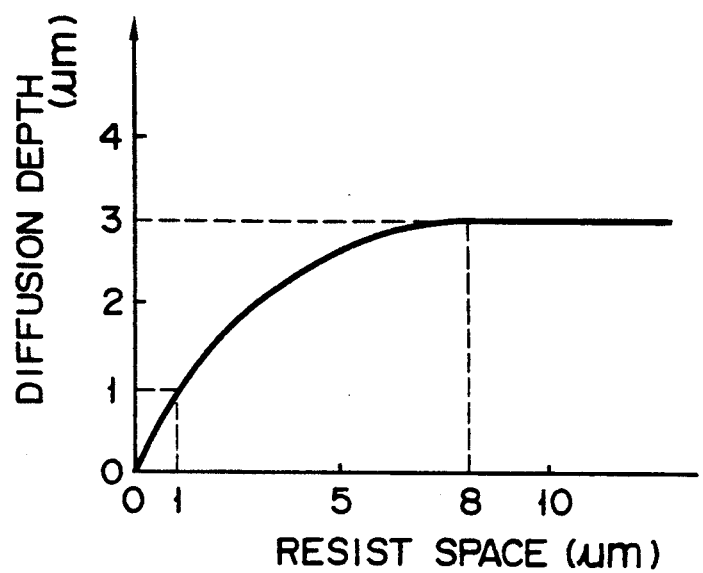
FIG. 3A is a graph of resist space—diffusion depth characteristics used for explaining the embodiment of the present invention.
Figure 3B:
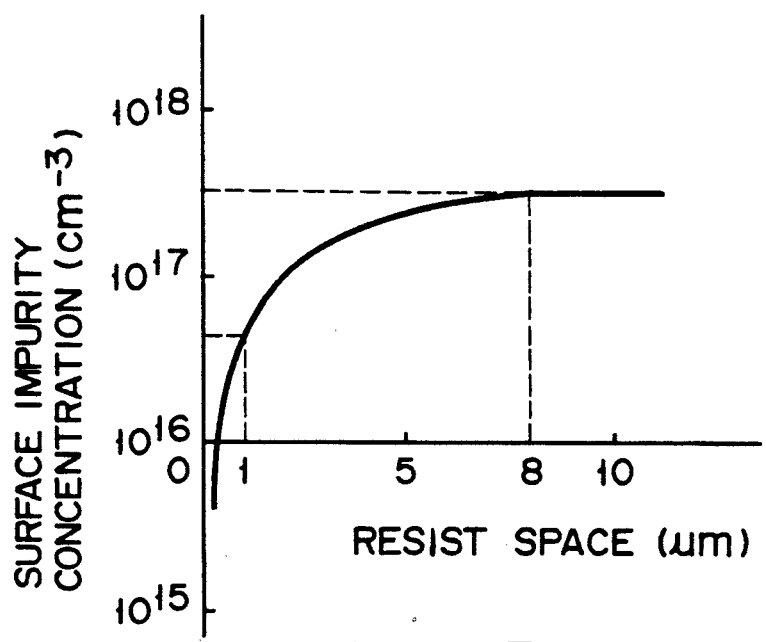
FIG. 3B is a graph of resist space—surface impurity concentration characteristics used for explaining the embodiment of the present invention.

FIG. 3A shows the resist space (opening pattern width)—diffusion depth characteristics of this embodiment, and FIG. 3B shows the resist space—diffusion layer surface impurity concentration characteristics of the same. The surface impurity concentration influences the threshold voltage of the MOS transistor. As is apparent from FIGS. 3A and 3B, when the opening pattern is set to have a width equal to or less than twice the diffusion depth, the surface impurity concentration is greatly reduced, and the diffusion depth becomes small. In other words, when the opening pattern width is set small, i.e., equal to or less than twice the diffusion depth, in the case of an n-channel MOS transistor, as in this embodiment, the threshold voltage can be changed in the positive direction (p-type impurity concentration is increased; n-type impurity concentration is decreased). When the pattern width becomes 0, the impurity concentration becomes identical to that of the p-type semiconductor substrate.

FIG. 4A is a plan view of a pattern according to another embodiment of the present invention, and FIG. 4B is a sectional view taken along the line A—A' of FIG. 4A. The same reference numerals as in FIGS. 2A to 2E denote the same or identical portions in FIGS. 4A to 4B. In this embodiment, a plurality of mask patterns $23_2$ for impurity implantation are arranged on the channel regions of the MOS transistors. In this case, the diameter of each mask pattern $23_2$ is equal to or less than twice its diffusion depth. More specifically, a plurality of circular resist patterns $23_2$ are formed in the channel regions of, e.g., MOS transistors, as shown in FIG. 4A. Phosphorus is implanted in these regions, and diffusion is subsequently performed to appropriately set the surface phosphorus concentration. As a result, the threshold voltages of the MOS transistors can be set.

Figure 5A:
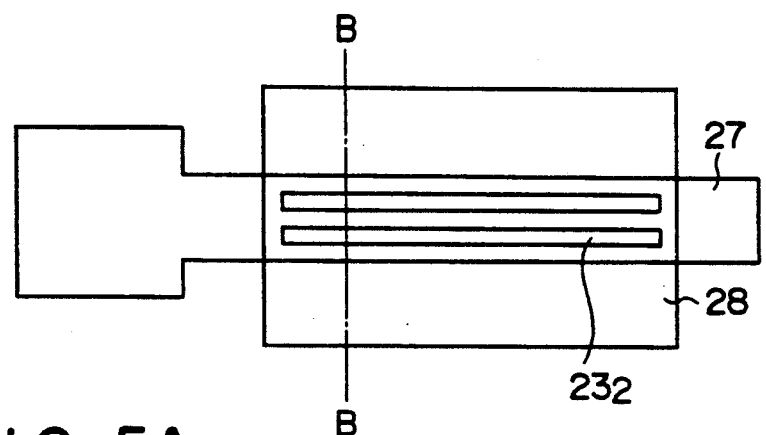
FIG. 5A is a plan view of a pattern of still another embodiment of the present invention.
Figure 5B:
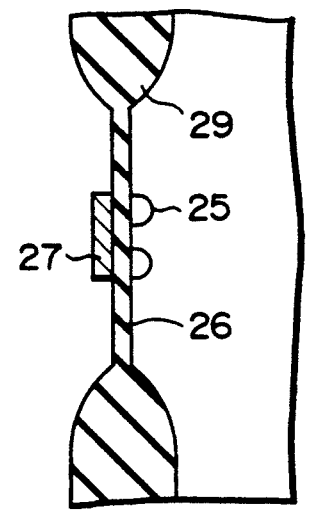
FIG. 5B is a sectional view taken along the line B—B of FIG. 5A.

Another narrow diffusion layer pattern can be arranged to be perpendicular to the channel lengthwise direction. FIG. 5A is a plan view of a pattern of this example, and FIG. 5B is a sectional view taken along the line B—B of FIG. 5A. In this embodiment, e.g., two mask patterns $23_2$ for impurity implantation are arranged parallel to the channel widthwise direction of the MOS transistors. In this case, the condition of the pattern width being equal to or less than twice the diffusion depth must apply only to the widthwise direction (shorter direction) of the mask patterns $23_2$, and need not apply to the lengthwise direction.

Figure 6:
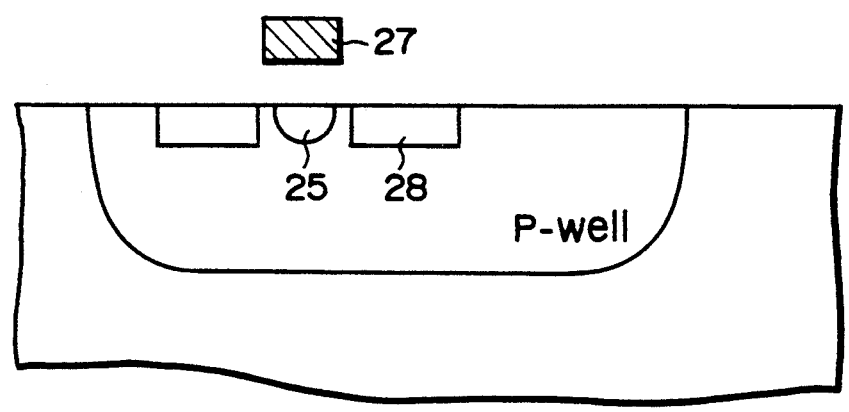
FIG. 6 is a schematic sectional view of still another embodiment of the present invention.

FIG. 6 shows still another embodiment of the present invention. When the threshold voltage goes more toward the plus side than the case of FIGS. 2A to 2E, a well 25 as shown in FIG. 6 may be adopted. The well 25 must similarly satisfy the above condition (the width must be equal to or less than twice the diffusion depth).

The present invention is not limited to the above embodiments but various changes and modifications can be made within the spirit and scope of the invention. For example, the shape of the mask pattern can be changed in various manners. In the above embodiments, the well is of a conductivity type opposite to that of the semiconductor substrate. However, the present invention can also be applied to an enhancement-type semiconductor device wherein the conductivity type of the well 25 is changed so that it will be of the same conductivity type as that of the substrate 21. In the above embodiments, the well has a "semi-circular" shape. However, it does not mean a true semi-circle but a shape whose bottom is not flat, unlike the well 24, but is curved, like the well 25.

According to the present invention, MOS transistors having different threshold voltages can be formed by the same manufacturing process (photoengraving steps) by forming a plurality of patterns having different opening diameters in a single mask, thus resulting in greatly simplified manufacturing steps.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A MOS device comprising:
   a semiconductor substrate of a first conductivity type having a major surface;
   a first insulating film on said major surface to define a MOS transistor region;
   a MOS transistor in said MOS transistor region including source and drain layers of a second conductivity type in said major surface and a gate electrode spaced from a channel region between said source and drain layers by a gate insulating film thinner than said first insulating film; and a well layer formed in and extending below said channel region to control a threshold voltage of said MOS transistor, said well layer having a substantially semi-circular section with a non-flat lower surface and non-flat sides.

2. A device according to claim 1, wherein said well layer is of the same conductivity type as that of said source and drain layers of said MOS transistor.

3. A device according to claim 1, wherein said well layer is of a conductivity type opposite to that of said source and drain layers of said MOS transistor.

4. A MOS device comprising:
a semiconductor body having a major surface;
a first insulating film on said major surface to define a MOS transistor region;
a MOS transistor in said MOS transistor region having a source layer and a drain layer formed in said semiconductor body to define a channel region therebetween, and a gate electrode spaced from said channel region by a gate insulating film thinner than said first insulating film; and
at least one well layer formed in and extending below said channel region to control a threshold voltage of said MOS transistor, said well layer having a substantially semicircular and continuously curved cross-section.

5. The MOS device according to claim 4, wherein said at least one well layer comprises one well layer.

6. The MOS device according to claim 5, wherein a length of said gate electrode in a direction parallel to a length of said channel region is equal to or less than twice a depth $X_j$ of said well layer.

7. The MOS device according to claim 4, wherein said source, drain, and well layers are of a same conductivity type.

8. The MOS device according to claim 4 wherein said source and drain layers are of a first conductivity type and said well layer is of a second conductivity type.

9. A MOS device comprising:
a semiconductor body having a major surface;
a first insulating film on said major surface to define a MOS transistor region;
a plurality of MOS transistors respectively formed in said MOS transistor regions, each MOS transistor comprising a source layer and a drain layer formed in said semiconductor body to define a channel region therebetween, and a gate electrode spaced from said channel region by a gate insulating film thinner than said first insulating film; and
well layers formed in and extending below said channel regions to control respective threshold voltages of said MOS transistor, said well layers having substantially semicircular and continuously curved cross-sections.

10. A MOS device comprising:
a semiconductor body;
a MOS transistor having a source layer and a drain layer formed in said semiconductor body to define a channel region therebetween, and a gate electrode insulatively spaced from said channel region; and
at least two well layers formed in said channel region to control a threshold voltage of said MOS transistor.

11. The MOS device according to claim 10, wherein said well layers have substantially semicircular and continuously curved cross-sections.

12. The MOS device according to claim 10 wherein said well layers have substantially semicircular cross-sections.

13. The MOS device according to claim 10, wherein said well layers comprise elongated well layers.

14. The MOS device according to claim 13, wherein said elongated well layers extend in a direction parallel to a width of said channel.

15. A MOS device, comprising:
a semiconductor body having a major surface;
first and second MOS transistors respectively formed in first and second MOS transistor regions on said major surface;
a first arrangement of well layers in a channel region of said first MOS transistor to set a threshold voltage of said first MOS transistor; and
a second arrangement of well layers in a channel region of said second MOS transistor to set a threshold voltage of said second MOS transistor which is different than the threshold voltage of said first MOS transistor.

* * * * *